(12) United States Patent
Sun (10) Patent No.: US 9,460,866 B2
(45) Date of Patent: Oct. 4, 2016

(54) METHOD OF FORMING A SURFACE MOUNT COMPONENT HAVING MAGNETIC LAYER THEREON

(71) Applicant: Intel Corporation, Santa Clara, CA (US)

(72) Inventor: Haixiao Sun, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/771,022

(22) Filed: Feb. 19, 2013

(65) Prior Publication Data

US 2013/0163142 A1 Jun. 27, 2013
US 2016/0284483 A9 Sep. 29, 2016

Related U.S. Application Data

(60) Division of application No. 12/839,091, filed on Jul. 19, 2010, now Pat. No. 8,378,228, which is a continuation of application No. 10/561,064, filed on Dec. 16, 2005, now Pat. No. 7,791,895.

(30) Foreign Application Priority Data

Aug. 19, 2005 (WO) ................ PCT/CN2005/001299

(51) Int. Cl.
*H05K 3/34* (2006.01)
*H01G 13/00* (2013.01)
(Continued)

(52) U.S. Cl.
CPC .............. *H01G 13/00* (2013.01); *H01G 2/02* (2013.01); *H05K 3/303* (2013.01); *H05K 3/3442* (2013.01);
(Continued)

(58) Field of Classification Search
CPC ........... H01L 21/67; H01L 2924/0002; H01L 2924/00; H05K 3/30; H05K 3/303; H05K 3/368; H05K 3/3442; H05K 3/244; H05K 2201/083; H05K 2201/10909; H05K 2203/043; H01G 13/00; H01G 2/02; Y02P 70/613; Y10T 428/24826; Y10T 29/4916; Y10T 29/4913; Y10T 29/49155
USPC ...... 29/832, 834, 840, 830; 228/6.2, 180.21; 257/750; 294/65.5; 361/779, 783; 438/3, 125

See application file for complete search history.

(56) References Cited

U.S. PATENT DOCUMENTS 3,439,416 A * 4/1969 Yando ............... G11C 11/06085
                                                    29/832
3,612,955 A * 10/1971 Butherus et al. ............... 29/834
(Continued)

FOREIGN PATENT DOCUMENTS

CN        1295782 A        5/2001
CN        1577825 A        2/2005
(Continued)

OTHER PUBLICATIONS

International Search Report and Written Opinion received for PCT Patent Application No. PCT/CN2005/001299 of the International Searching Authority mailed Nov. 17, 2005, 9 Pages.
(Continued)

*Primary Examiner* — Donghai D Nguyen
(74) *Attorney, Agent, or Firm* — Schwabe, Williamson & Wyatt, P.C.

(57) ABSTRACT

A microelectronic assembly, a surface mount component and a method of providing the surface mount component. The assembly comprises: a substrate having bonding pads disposed on a mounting surface thereof, the bonding pads including a ferromagnetic material therein; solidified solder disposed on the bonding pads; and a surface mount component bonded to the substrate by way of the solidified solder and including a magnetic layer disposed on a substrate side thereof, the magnetic layer being adapted to cooperate with the ferromagnetic material in the bonding pads to establish a magnetic force of a sufficient magnitude to hold the surface mount component on the substrate before and during soldering.

9 Claims, 6 Drawing Sheets

(51) Int. Cl.
*H05K 3/30* (2006.01)
*H01G 2/02* (2006.01)
*H05K 3/24* (2006.01)

(52) U.S. Cl.
CPC ....... *H01L 2924/0002* (2013.01); *H05K 3/244* (2013.01); *H05K 2201/083* (2013.01); *H05K 2201/10909* (2013.01); *H05K 2203/043* (2013.01); *Y02P 70/613* (2015.11); *Y10T 428/24826* (2015.01)

(56) References Cited

U.S. PATENT DOCUMENTS

| | | | |
|---|---|---|---|
| 3,868,764 A * | 3/1975 | Hartleroad et al. | 228/6.2 |
| 3,960,279 A * | 6/1976 | Hartleroad et al. | 228/6.2 |
| 4,983,804 A | 1/1991 | Chan et al. | |
| 5,986,348 A | 11/1999 | Fukano | |
| 6,049,974 A * | 4/2000 | Asanasavest | 29/832 |
| 6,255,581 B1 | 7/2001 | Reis et al. | |
| 6,364,196 B1 | 4/2002 | Wood et al. | |
| 6,618,267 B1 | 9/2003 | Dalal et al. | |
| 7,429,797 B2 | 9/2008 | Coenen | |
| 7,482,199 B2 | 1/2009 | Khandekar et al. | |
| 7,791,895 B2 | 9/2010 | Sun | |
| 2004/0262719 A1 | 12/2004 | Seki et al. | |

FOREIGN PATENT DOCUMENTS

| | | |
|---|---|---|
| JP | 07-0221260 A | 1/1995 |
| WO | WO 2007/019732 A1 | 2/2007 |

OTHER PUBLICATIONS

Office Action received for Chinese Patent Application No. 200580051333.6 mailed Jan. 22, 2010, 7 pages of Chinese Office Action including 4 pages of English Translation.

Office Action received for Korean Patent Application No. 10-2008-7003831 mailed May 19, 2010, 8 pages of Korean Office Action including 4 pages of English Translation.

International Preliminary Report on Patentability received for PCT Patent Application No. PCT/CN2005/001299 of the International Searching Authority mailed Feb. 20, 2008, 4 pages.

Office Action received for Chinese Patent Application No. 200580051333.5 mailed May 8, 2009, 6 pages of Chinese Office Action and 10 pages of English Translation.

Office Communication mailed Mar. 10, 2011 for U.S. Appl. No. 12/839,091, filed Jul. 19, 2010.

Office Communication mailed Jul. 26, 2011 for U.S. Appl. No. 12/839,091, filed Jul. 19, 2010.

Office Communication mailed Feb. 25, 2009 for U.S. Appl. No. 10/561,064, filed Dec. 16, 2005.

Office Communication mailed Dec. 14, 2009 for U.S. Appl. No. 10/561,064, filed Dec. 16, 2005.

\* cited by examiner

(PRIOR ART)

*FIG. 1A*

(PRIOR ART)

(PRIOR ART)

FIG. 7

METHOD OF FORMING A SURFACE MOUNT COMPONENT HAVING MAGNETIC LAYER THEREON

This is a Divisional application of Ser. No. 12/839,091 filed Jul. 19, 2010 now U.S. Pat. No. 8,378,228 which is a Continuation application of Ser. No. 10/561,064 filed Dec. 16, 2005 now U.S. Pat. No. 7,791,895 issued Sep. 7, 2010.

FIELD

Embodiments of the present invention relate to electronic assemblies and, more particularly, to anti-flip/anti-shift/anti-tombstoning structures and associated fabrication methods.

BACKGROUND

One of the conventional ways of mounting components on a substrate is called surface mount technology (SMT). SMT components have terminals or leads (generally referred to as "electrical contacts", "bumps", or "pads") that are soldered directly to the surface of a substrate. SMT components are widely used because of their compact size and simplicity of mounting. The electrical contacts of an SMT component are coupled to corresponding electrically conductive mounting or bonding pads (also referred to as "lands") on the surface of the substrate, in order to establish secure physical and electrical connections between the component and the substrate. In order to fabricate PCBs in higher densities, it is known to surface-mount certain small passive components, such as capacitors, resistors, and inductors. The resulting electronic system can be manufactured at a lower cost and in a more compact size, and it is therefore more commercially attractive.

Before SMT components are mounted on a substrate, the substrate pads are selectively coated with corresponding solder deposits. Next, the component is carefully positioned or "registered" over the substrate, so that its electrical terminals are aligned with the corresponding substrate pads. Finally, in an operation known as "soldering," the component terminals and the PCB pads are electrically and mechanically bonded together through a solidification of the solder deposits. An example of a soldering method includes solder reflow, a process during which the component terminals and the PCB pads are first heated to a temperature that melts the solder deposit, and during which the combination is then allowed to cool, so that the solider solidifies into solidified solder, and such that the terminals and pads thus make proper electrical and physical connections.

Figure 1A:
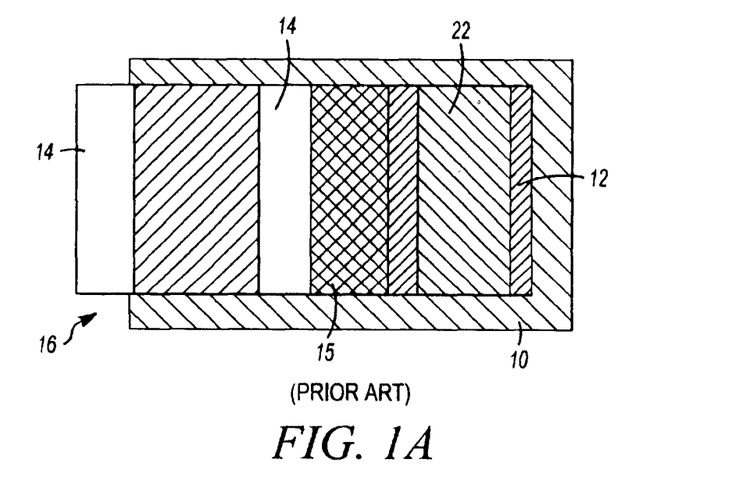
FIG. 1a is a top plan view of a DSC and substrate combination according to the prior art in which the DSC has shifted onto one of the substrate pads.
Figure 1B:
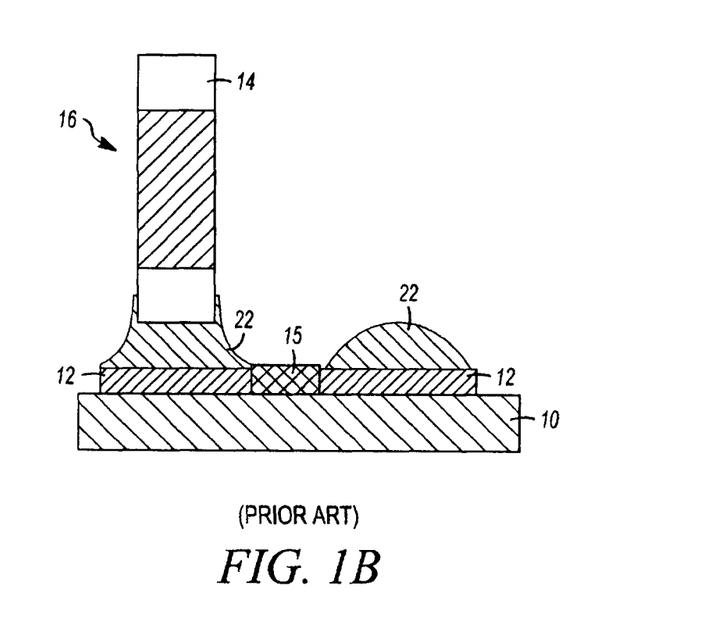
FIG. 1b is a side elevational view of a DSC and substrate combination according to the prior art in which the DSC has tombstoned.

Typically, for example as seen in FIGS. 1a and 1b, a substrate 10 has pairs of pads 12 to which terminals 14 of SMT components, such as die side capacitor or DSC 16, can be mounted. Solder resist 15 is disposed between the two pads 12. Asymmetrical, lateral, surface-tension forces due to uneven surface tension of solder deposits 22 on the pads 12 during soldering can cause the DSC 16 to either shift, as seen in FIG. 1a, or tombstone, as seen in FIG. 1b. FIG. 1a shows a top view of DSC 16 as having shifted away from one of the substrate pads 12 to cover an adjacent substrate pad, while FIG. 1b shows a side view of DSC 16 as having tombstoned. Flipping, shifting and/or tombstoning of SMT components will be referred to herein as SMT component defects or SMTC defects. The tombstoning effect is considered a common soldering defect in the mounting of SMT components, and is caused by a combination of the surface tension of the solder, the SMT component's weight, and the soldering conditions. Another factor contributing to SMTC defects may include a vibration of the conveyor belt transporting the SMT component during soldering. SMTC defects having been observed at assembly sites especially recently with respect to DSC's whose dimension and weight have been reduced from 0805 (this terminology means that the components that have a length of 8 mil. and a width of 5 mil.) and 0402 to 0201. Because of the relatively small dimensions and weights of 0402 and 0201 components, the intricate balance of the surface tension may be more easily disturbed by either the change of the solderability of the components or by the differences of time at which the solder paste at each end of the component begins to melt.

The prior art has attempted to resolve SMTC defects caused during the mounting process by tuning either the solder paste printing process, the solder reflow process or the solder paste formulation. Tuning the solder paste printing process typically involves redesigning the printing stencils for the solder pads to change the solder printing parameters for reflow. Tuning the reflow process on the other hand typically involves extending the preheating time and the soaking time in order to achieve the desired balance between the surface tension forces on the component's terminals. A slower preheating rate has been shown to reduce SMTC defect rates. Tuning the paste formulation involves employing a solder alloy comprising tin/lead/silver in order to provide a wider solidification range and achieve balance between the surface tension of both side of a small leadless component. The expanded solidification range lengthens the higher tacky and pasty stage of the solder paste in the solder deposits, thus balancing a surface tension on the component's terminals, and in turn reduce the tombstoning frequency.

Figure 7:
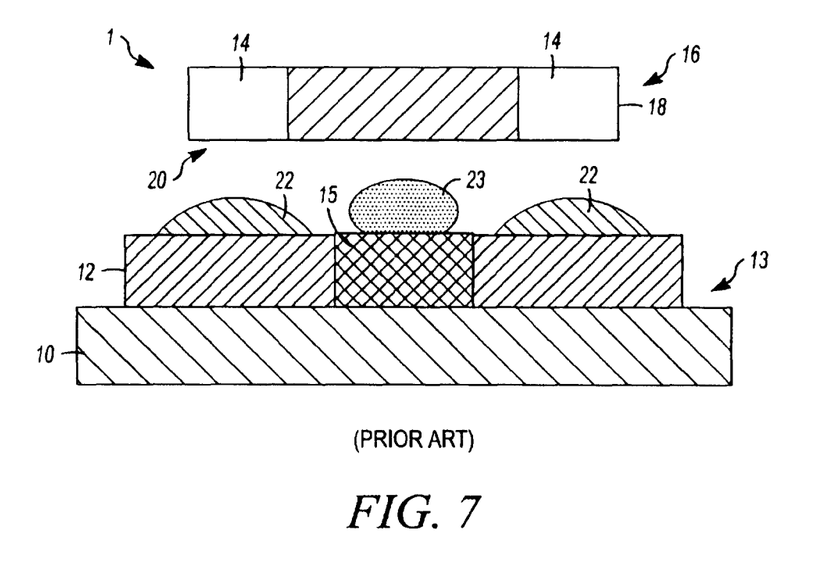
FIG. 7 is a is a side elevational view of a DSC and substrate combination according to the prior art in which an adhesive is being used to hold the DSC in place during soldering.

An alternative measure used in the prior art in order to reduce the occurrence of SMTC defects contemplates using an adhesive to hold the capacitor in place during soldering of a pre-mount combination 1 as shown. In such a method, as seen in FIG. 8, where like components are referred to using like reference numerals with respect to FIGS. 1a and 1b described above, an adhesive is dispensed on the solder resist 15 between the two substrate pads 12 as shown. The adhesive is meant to hold the capacitor in place during soldering in an attempt to reduce SMTC defects. However, disadvantageously, as SMT component sizes shrink, as noted in the paragraph above, use of the adhesive method becomes ill suited to combat SMTC defects to the extent that it among others requires an accurate placement of the adhesive and an accurate dispensing of the same, which become more difficult where small spaces/doses are involved, often requiring a fine tuning of the adhesive dispensing machine. For the reasons stated above, and for other reasons stated below which will become apparent to those skilled in the art upon reading and understanding the present specification, there is a significant need in the art for methods for mounting components to a substrate that offer relatively high density and high quality interconnections at a reasonable production cost.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION

A surface mount component including a magnetic layer thereon, a method of forming the surface mount component, an electronic assembly including the surface mount component, and an electronic system including the electronic assembly are disclosed herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "one embodiment" is used repeatedly. The phrase generally does not refer to the same embodiment, however, it may. The terms "comprising", "having" and "including" are synonymous, unless the context dictates otherwise.

Figure 2A:
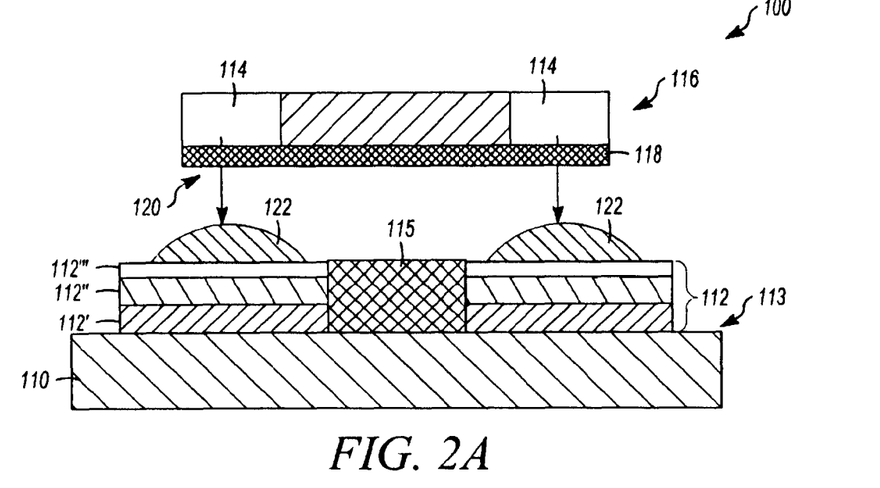
FIGS. 2a and 2b are side elevational views of a pre-assembly combination according to an embodiment before and during reflow, respectively.
Figure 2B:
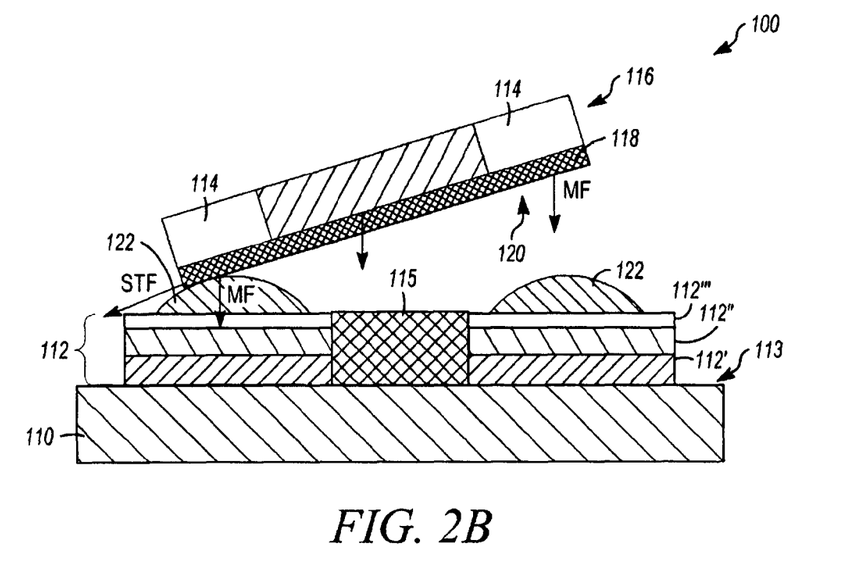

Referring to FIGS. 2a and 2b, a pre-mount combination 100 is shown prior to and during reflow, respectively. Combination 100 as shown includes a substrate 110 having bonding pads 112 on a bonding surface 113 thereof, and including a solder resist 115 thereon. The shown bonding pads 112 may comprise ENIG bonding pads. As is well known in the art, an ENIG bonding pad may be made by providing copper pads using methods well known by those versed in the art. The copper bonding pads may then be put into the proper nickel containing bath for a predetermined length of time to deposit a specific range of nickel thickness by electrochemical means. After proper rinsing, the bonding pads may then be put into a gold containing electrochemical bath where the gold atoms spontaneously replace the surface nickel atoms until the entire nickel surface areas are covered by gold. A result of the above well known process are bonding pads such as bonding pads 112, which include a copper layer 112', a nickel layer 112" thereon, and a gold layer 112''' covering the nickel layer. Gold has long been used in the electronics industry as a metal for contact surfaces because of its low electrical resistivity and its inertness to attack by corrosive substances. Combination 100 as shown further includes a surface mount component such as DSC 116 having terminals 114. DSC 116 includes a magnetic layer 118 provided on a die-side surface 120 thereof.

As seen in FIG. 2a, the DSC 116 is shown as being in the process of being registered over the substrate 110 such that the terminals 114 register with the solder deposits 122 on the bonding pads 112. Before reflow when the DSC has been registered over the substrate, magnetic layer 118 and nickel layer 112" (which has ferromagnetic properties) in the ENIG bonding pads interact to establish a magnetic force MF between DSC 116 and substrate 110 that among others advantageously holds the DSC over the substrate to allow the DSC to remain registered over the substrate pads before reflow.

As seen in FIG. 2b, when combination 100 is undergoing reflow, uneven surface tension forces STF between bonding pads 112 on each side of the DSC can produce a torque on the DSC 116 that may be counteracted by a magnetic torque caused by magnetic forces MF acting between magnetic layer 118 and the nickel layer 112" present in the ENIG bonding pad 112. Such counteraction is effective for substantially preventing SMTC defects such as flipping, shifting or tombstoning as shown in part in FIGS. 1a and 1b. The magnetic layer may be chosen such that MF is larger than STF, increasing a holding force between the DSC and underlying substrate before and during reflow for bringing about reduced SMTC defects, such as, for example, for 0402 and/or 0201 DSC's.

It is noted that, as used in the instant description, what is meant by "hold" or "holding" refers to holding an SMT component on the substrate such that, before reflow, the SMT component remains registered on the substrate, and, during reflow, the SMT component does not flip, shift or tombstone.

The magnetic layer 118 may be disposed on the DSC, according to one embodiment, during DSC manufacturing, such as using a conventional printing method. According to embodiments, magnetic layer is selected to provide a magnetic force MF that produces a torque larger than a torque produced by uneven surface tension forces STF of the two solder deposits 22, while at the same time having minimal impact on the performance of circuits on the substrate or on the SMT component. Preferably, a magnetic material is selected having a Courier temperature that is slightly higher than the reflow peak temperature range of the solder to undergo reflow. For example, the Courier temperature of the magnetic material chosen may be between about 10 degrees Celsius to about 20 degrees Celsius higher than a reflow peak temperature range of the solder. In such a case, where lead-containing solder is used, the peak reflow temperature range would be between about 210 degrees Celsius and about 220 degrees Celsius, in which case the Courier temperature range acceptable for the purposes of embodiments would be between about 220 degrees Celsius and about 240 degrees Celsius. In addition, where lead-free solder is used, the peak reflow temperature range would be between about 240 degrees Celsius and about 250 degrees Celsius, in which case the Courier temperature range acceptable for the purposes of embodiments would be between about 260 degrees Celsius and about 270 degrees Celsius. A magnetic material with a Courier temperature below the reflow peak temperature range could substantially lose its magnetic properties during reflow, thus disadvantageously leading to an effective disappearance of a counteracting magnetic force MF between the SMT component such as DSC 116, and the underlying substrate. More preferably, a magnetic material is selected that exhibits a remanence adapted to have a minimum impact on a performance of circuits within the SMT component or within the substrate. A selection of magnetic materials based on remanence and its impact on circuit performance becomes especially important in the case of circuits having higher frequencies, such as frequencies equal to or above about 2 GHz, as in the case of a CPU. On the other hand, a magnetic material according to embodiments exhibits a remanence that nevertheless provides the necessary counteracting force to counteract a torque on the SMT component by unequal surface tension forces between the solder deposits on the substrate bonding pads. Examples of magnetic materials that may be used as part of the magnetic layer according to a preferred embodiment may include any one of nickel or ferronickel alloys. In the case of ferronickel alloys, their compositions may be engineered in a well known manner to obtain a specific remanence according to application needs.

It would be within the knowledge of one skilled in the art to use techniques such as simulation, taking into account for example the dimensions, including terminal dimensions, of the SMT component, the weight of the SMT component, and, in addition, the surface tension torque on the SMT component from one of the solder deposits, in order to arrive at a magnetic force torque necessary to counterbalance the solder's torque in order to substantially prevent SMTC defects. Based on the thus found magnetic force torque, a magnetic layer may be selected to generate such magnetic torque during reflow. In general, using guidelines such as those provided in the paragraph above, a magnetic material layer may be selected that provides the minimum magnetic force necessary to effect the desired counterbalancing of the DSC. Such a magnetic layer may have any thickness and define any pattern based on the magnetic torque requirements for the specific combination being evaluated. For example, the magnetic layer according to an embodiment may have a thickness in the same range as the thickness of the nickel layer in the ENIG pads, that is, between about 1 micron and about 5 microns.

Figure 3A:
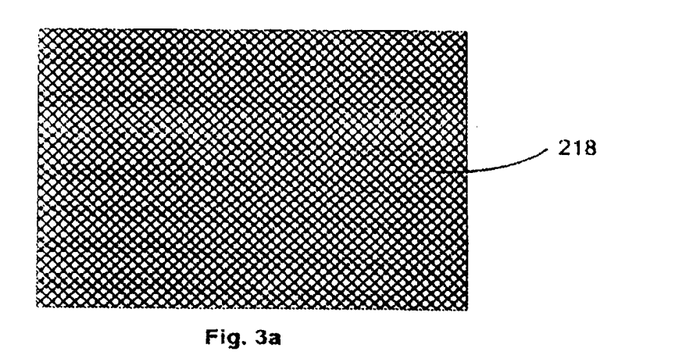
FIGS. 3a-3c are top plan views of three different embodiments of a magnetic layer according to the present invention.
Figure 3B:
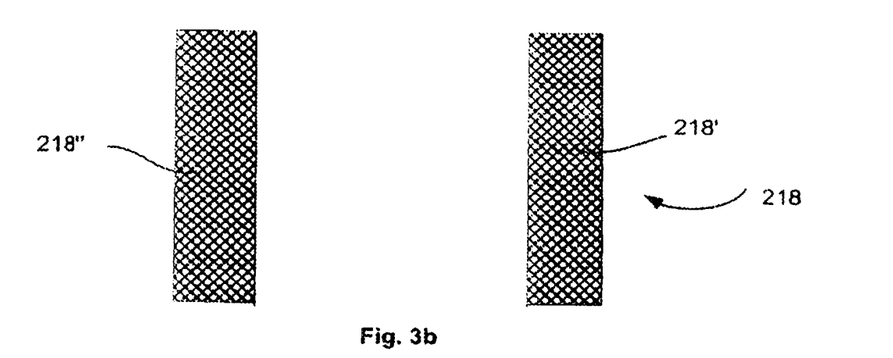
Figure 3C:
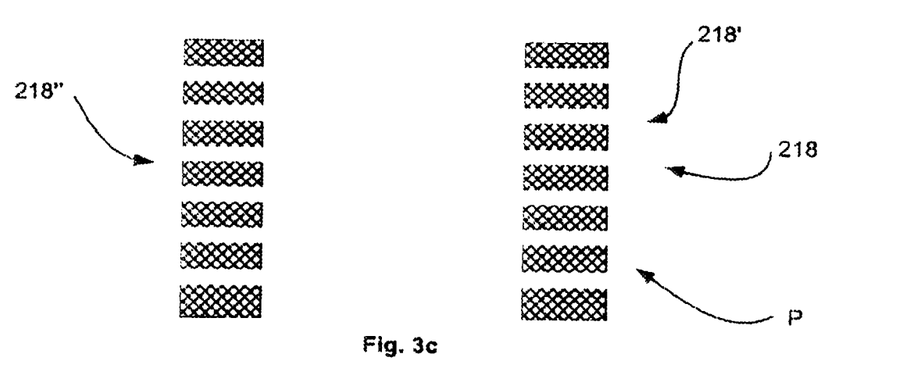

It is noted that, as used herein, "magnetic layer" refers to both a continuous and a non-continuous layer of magnetic material. Thus, referring by way of example to FIGS. 3a, 3b and 3c, a magnetic layer according to embodiments may comprise a continuous layer, as shown in top plan view in FIG. 3a, or, as shown in top plan view in FIGS. 3b and 3c, a layer having a discontinuous configuration, such as one defining a pattern. According to one embodiment, a magnetic layer may comprise sublayers defining a pattern that is adapted to minimize impact on the SMT circuits from a magnetic field of the magnetic layer. For example, as seen in the embodiment of FIG. 3b, a magnetic layer may comprise sublayers defining a pattern in top plan view that corresponds to a pattern of the substrate pads. Thus, as seen in particular in FIG. 3b, where the SMT terminals define a pattern as shown for example in FIGS. 1a-2b, magnetic layer 218 may comprise two sublayers 218' and 218" that are each configured to be placed on a corresponding one of the substrate pads. As seen by way of example in the embodiment of FIG. 3c, a magnetic layer 218 may comprise sublayers 218' and 218" which each define a pattern P as shown. It is noted that FIGS. 3a-3c merely show examples of magnetic layer configurations, and that other configurations are within the scope of embodiments of the present invention.

With respect to the substrate pads, it is noted that it is not necessary according to embodiments that the pads be ENIG pads. Embodiments of the present invention encompass within their scope substrate pads other than ENIG pads as long as the substrate pads include a ferromagnetic material therein adapted to cooperate with the magnetic layer as described above in order to establish a magnetic force to counteract unequal surface tension forces of the solder deposits.

Example

Figure 4A:
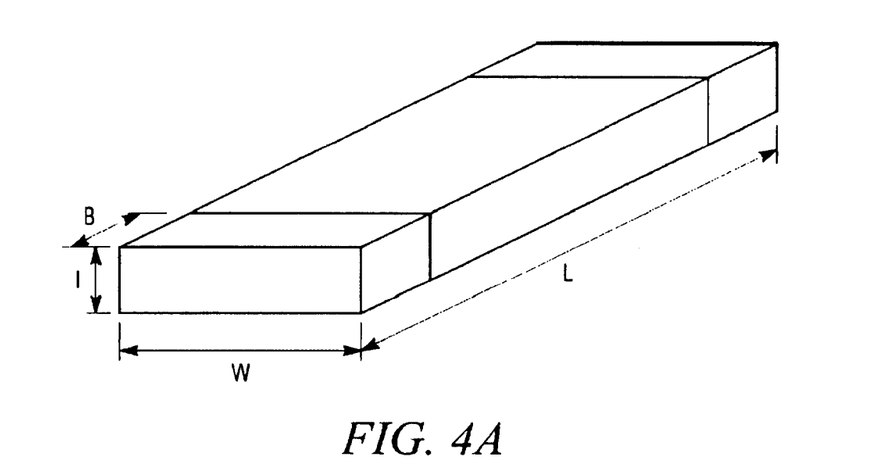
FIG. 4a is a perspective view of a surface mount component comprising a DSC.
Figure 4B:
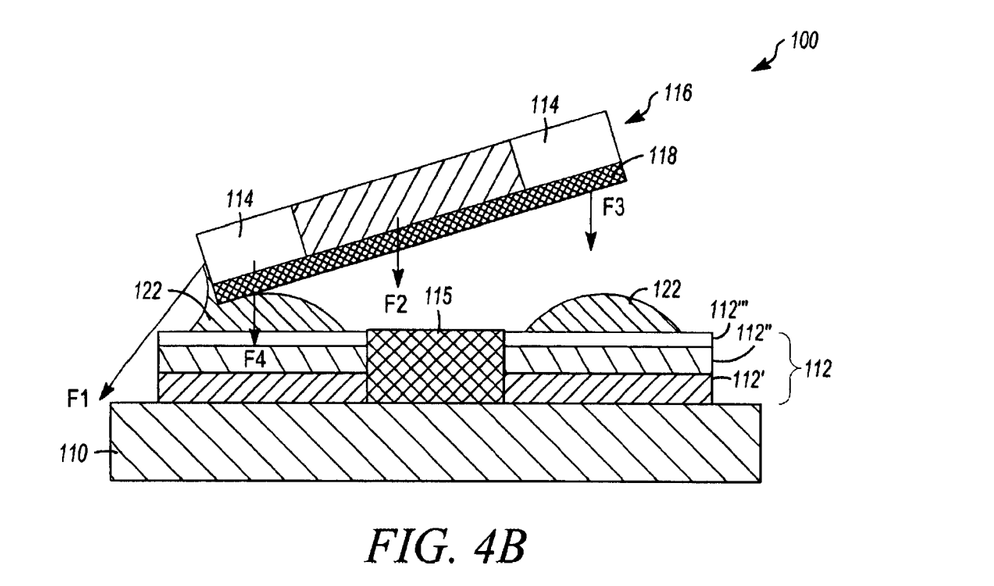
FIG. 4b is a side elevational view of the DSC of FIG. 4a being surface mounted onto a substrate.

With respect to the selection of a suitable magnetic layer according to embodiments, the following calculations are provided as an example with respect to a 0402 DSC referring in particular to the illustrations in FIGS. 4a and 4b. Thus, according to one embodiment, DSC 116 may be an 0402 DSC, in which case the dimensions and properties of the same are as follows:

DSC specific gravity: $\rho=5.85\times10^{-3}$ g/mm$^3$
DSC volume: $V=L\times W\times H=1\times0.5\times0.5=0.25$ mm$^3$
DSC pad dimension: $B\times W=0.2\times0.5=0.1$ mm$^3$
DSC mass: $M=\rho\times V=1.4625\times10^{-3}$ g
DSC weight: $W=\rho\times V\times g=1.4625\times10^{-2}$ N
Using Eutectic SN63/Pb37 as solder, the surface tension would be $\delta=464$ mN/mm. As a result, a surface tension force on the DSC's terminal side would be $F_1=\delta\times W=232$ mN, and the surface tension torque would be $T_1=(F_1\times H)/\cos\theta=164\times10^{-6}$ NM. On the other hand, the gravity torque would be $T_2=(W\times L)/(\cos\theta\times2)=9.9\times10^{-6}$ Nm. As seen above, $T_1>>T_2$, which would cause the tombstoning of the DSC. Assuming the magnetic force of the film is ten times larger than the weight of the capacitor, then $F_3=F_4=10$ W$=14.625\times10^{-2}$ N, the magnetic torque would be $T_3=(F_3\times L)/\cos\theta=206.9\times10^{-6}$ Nm, and $T_4=F_4\times0=0$. Thus, the total clockwise torque on the DSC TCLT=$T_2+T_3+T_4=216.8$ u$\times10^{-6}$ Nm, while the total counterclockwise torque on the DSC TCOT=$T_1=164\times10^{-6}$ Nm. Because TCLT/TCOT=216.8/164>1, the DSC will not tombstone.

Advantageously, embodiments of the present invention provide a simple, cost effective, and operative configuration to hold a SMT component over a substrate before and during reflow. In particular, as compared with conventional methods of minimizing SMTC defects by engineering and monitoring solder paste formulations, and the associated printing and reflow processes, embodiments of the present invention take advantage of ferromagnetic properties of the substrate pads, such as, for example, of natural ferromagnetic properties of the nickel layer in the ENIG pad on the substrate, in order to hold a SMT component over a substrate before and during reflow. In addition, advantageously, according to embodiments of the present invention a stabilizing and holding force between the SMT component and the substrate is a function of a magnetic field of a magnetic layer on the SMT component, the provision of which onto the SMT component would be easier to control when compared with traditional methods of minimizing SMTC defects as noted above, and also when compared with other SCAM process parameters. In addition, advantageously, embodiments of the present invention provide a universal method of minimizing SMTC defects without a need to develop separate materials and/or processes as the size of the SMT components changes. The above is all the more advantageous in light of the miniaturization trend surrounding SMT components, such as a transition from 0805 DSC's to much smaller 0201 DSC's. Additionally, and in particular with respect to DSC's, to the extend the a main function of a DSC is the provision of stable voltage during a powering on and powering off of a device associated with the DSC as opposed to logic/storage, the provision of a magnetic layer on the DSC according to embodiments would advantageously substantially not affect a functioning of the DSC. Additionally, all of the above advantages are possible according to embodiments without the necessity to make any changes to the mounting/assembly equipment used for mounting the SMTC onto the substrate. The above advantages allow a stable and high capacitor attach yield and improve a process window for soldering with substantially no impact to the mounting equipment.

Figure 5:
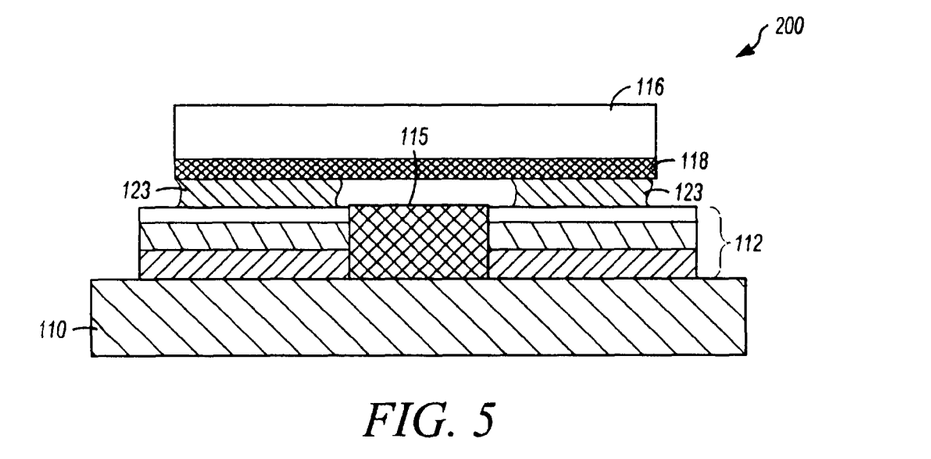
FIG. 5 is a side elevational view of a microelectronic assembly according to one embodiment.

Referring next to FIG. 5, an embodiment of a microelectronic assembly according to the present invention is depicted as assembly 200. As shown in FIG. 5, assembly 200 represents combination 100 of FIGS. 2a and 2b after reflow and subsequent attachment of DSC 116 to substrate 110. As seen in FIG. 5, assembly 200 shows DSC 116 as having been attached or bonded, that is, electrically and mechanically bonded, to ENIG pads 112 of substrate 110 via solidified solder 123. DSC 116 includes a magnetic layer 118 disposed thereon, which, as described above, stabilizes the DSC over the substrate before and during reflow.

Figure 6:
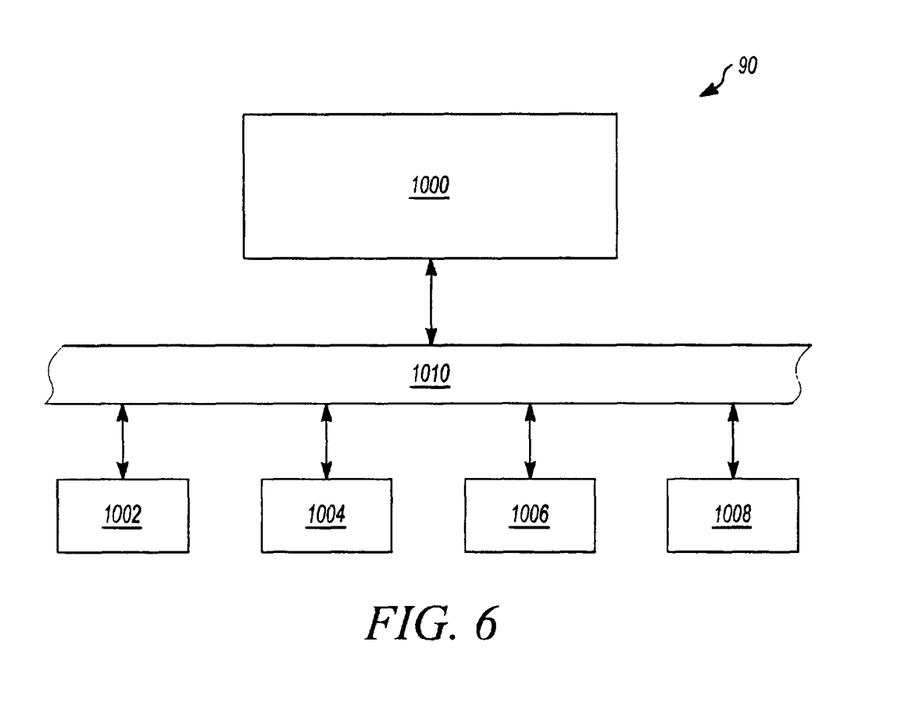
FIG. 6 is a schematic representation of a system including a microelectronic assembly such as the assembly of FIG. 5 according to one embodiment.

Referring now to FIG. 6, there is illustrated one of many possible systems 90 in which embodiments of the present invention may be used. The microelectronic assembly 1000 may be similar to the microelectronic assembly 200 depicted above in FIG. 5, respectively. In one embodiment, the electronic assembly 1000 may include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted in FIG. 6, the system 90 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method comprising:
providing a surface mount component with a substrate side adapted to be bonded to bonding pads of a substrate via solder deposits;
providing a magnetic layer disposed as a continuous layer across substantially all of the substrate side of the surface mount component, the magnetic layer cooperates with a ferromagnetic material in the bonding pads of the substrate to establish a magnetic force of a sufficient magnitude to hold the surface mount component on the substrate before and during soldering.

2. The method of claim 1, wherein providing a magnetic layer comprises printing a magnetic material onto the substrate side of the surface mount component.

3. The method of claim 1, wherein the surface mount component is a capacitor.

4. The method of claim 1, wherein soldering comprises a reflow process, and wherein the magnetic layer comprises a magnetic material having a Courier temperature that is above a peak reflow temperature range of the solder.

5. The method of claim 1, wherein the magnetic layer comprises a magnetic material including at least one of nickel and a ferronickel alloy.

6. The method of claim 1, wherein the magnetic layer has a thickness between about 1 micron and about 5 microns.

7. The method of claim 1, wherein the ferromagnetic material is a layer of a plurality of layers of the bonding pads.

8. The method of claim 7, wherein the ferromagnetic material is an intermediate layer of the plurality of layers of the bonding pads.

9. The method of claim 1, further comprising soldering the surface mount component to the substrate via reflow of the solder deposits.

* * * * *